(12) United States Patent
Lin

(10) Patent No.: US 8,715,453 B2
(45) Date of Patent: May 6, 2014

(54) METHOD FOR PREPARING CONSOLIDATED MULTI-LAYER ARTICLE USING CURABLE EPOXY COMPOSITION WITH QUATERNARY AMMONIUM BICARBONATE CURING CATALYST

(75) Inventor: Pui-Yan Lin, Hockessin, DE (US)

(73) Assignee: E I du Pont de Nemours and Company, Wilmington, DE (US)

( * ) Notice: Subject to any disclaimer, the term of this patent is extended or adjusted under 35 U.S.C. 154(b) by 160 days.

(21) Appl. No.: 13/327,795

(22) Filed: Dec. 16, 2011

(65) Prior Publication Data
US 2013/0153143 A1    Jun. 20, 2013

(51) Int. Cl.
*C09J 163/00*    (2006.01)
*C09J 163/02*    (2006.01)

(52) U.S. Cl.
USPC .......................................... 156/330; 525/378

(58) Field of Classification Search
USPC .......... 156/307.7, 330, 330.9, 331.9; 525/378
See application file for complete search history.

(56) References Cited

U.S. PATENT DOCUMENTS

| | | | | |
|---|---|---|---|---|
| 3,911,475 | A | * | 10/1975 | Szedon et al. ................ 257/786 |
| 4,130,549 | A | * | 12/1978 | Ueno et al. ..................... 528/93 |
| 4,354,015 | A | | 10/1982 | Doorakian et al. |
| 4,405,766 | A | | 9/1983 | Bertram et al. |
| 5,488,184 | A | * | 1/1996 | Reman et al. ................ 568/867 |
| 7,592,067 | B2 | | 9/2009 | Christiansen et al. |
| 7,612,130 | B2 | | 11/2009 | Kim |
| 2008/0152921 | A1 | * | 6/2008 | Kropp .......................... 428/414 |
| 2010/0056671 | A1 | | 3/2010 | Dershem |

FOREIGN PATENT DOCUMENTS

JP    1991149216 A    6/1991

* cited by examiner

*Primary Examiner* — Scott W Dodds

(57) ABSTRACT

Quaternary ammonium bicarbonates are suitable for use as catalysts in curable epoxy compositions. The curable compositions prepared therewith are used to prepare coated substrates, and to produce conformally sealed printed wiring boards and flexible circuits. Methods for preparation and curing are also provided. Of particular utility are compositions comprising benzytrimethyl ammonium bicarbonate. The curable composition is coated onto a first film or sheet, including a polyimide film or sheet. The coated sheet is then contacted to the surface of second film or sheet, where preferably there are discrete metallic conductive pathways disposed thereupon.

11 Claims, 1 Drawing Sheet

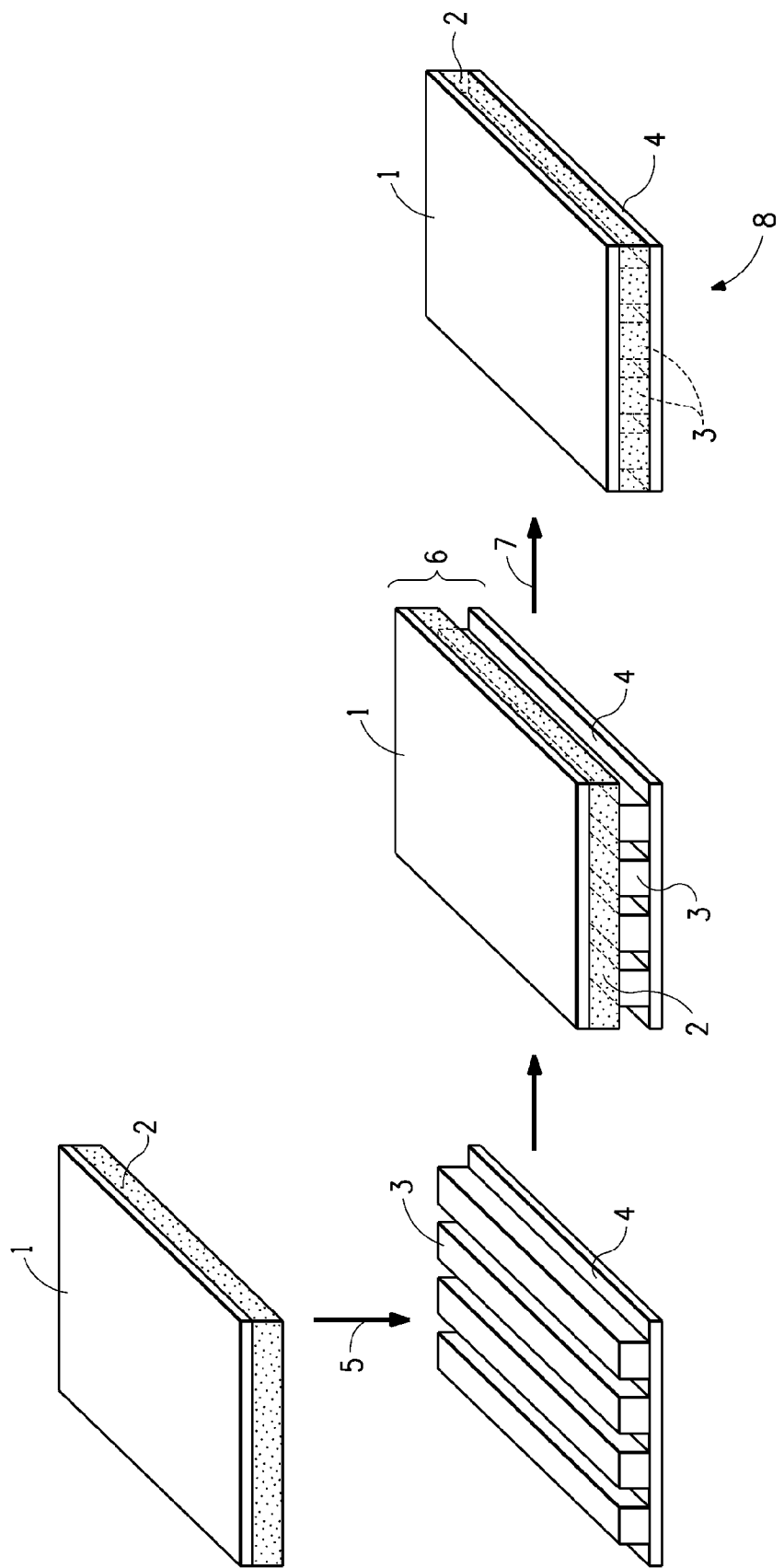

METHOD FOR PREPARING CONSOLIDATED MULTI-LAYER ARTICLE USING CURABLE EPOXY COMPOSITION WITH QUATERNARY AMMONIUM BICARBONATE CURING CATALYST

CROSS REFERENCE TO RELATED APPLICATIONS

This patent application is related to copending applications U.S. patent application Ser. No. 13/327793, entitled "Coated Article Comprising Curable Epoxy Composition With Quaternary Ammonium Bicarbonate Curing Catalyst, And Method For Preparing;" and U.S. patent application Ser. No. 13/327792, entitled "Curable Epoxy Composition With Ammonium Bicarbonate Curing Catalyst."

FIELD OF THE INVENTION

This invention is related to a method for preparing a multi-layer article, particularly a conformably sealed flexible printed wiring circuit. The method involves the use of a curable epoxy composition comprising a quaternary ammonium bicarbonate catalyst.

BACKGROUND OF THE INVENTION

Epoxy compositions are in wide-spread commercial use as adhesives, providing very strong bonding between surfaces by virtue of the three-dimensional cross-linked polymeric network that is formed upon curing of the epoxy. Curable epoxy compositions nearly universally comprise a plurality of polymeric molecules each having a plurality of cross-linkable epoxide functional groups, and optionally, one or more so-called curing agents, or cross-linking agents. Epoxy can form cross linking by itself without curing agent or catalyst, albeit slowly. Curing agents contain functional groups that can react with epoxy groups, provide the desired cross-links, expedite the cross-linking process, and control cross-link density. Catalyst is added to accelerate the cure. A latent catalyst is one that is typically thermally activated, and serves to induce a high rate of curing at a controlled temperature.

Curable epoxy compositions normally comprise curing catalysts in order to reduce the curing time thereof. However, the presence of a curing catalyst in a curable composition in storage tends to induce some degree of undesirable premature curing thereby reducing storage time. Refrigeration is often used to prevent untimely curing of a stored uncured or partially cured epoxy composition. Cure rate can be increased at higher catalyst loading, but generally at the expense of storage life. This balance between need for storage life and cure rate limits the amount of catalyst that can be employed. A latent or in-situ generated catalyst allows a shift in balance towards higher reaction rate without sacrificing storage life.

In order to bring the above stated problems under control, it has been found in the art to employ so-called latent catalysts. A latent catalyst is one that does not catalyze curing of the epoxy composition until some threshold condition, typically a threshold temperature, is reached. However, the requirements for a latent catalyst to be of practical use are stringent. A latent catalyst should not be activated until the desired curing temperature is reached, typically in the range of 120 to 200° C.

Most latent catalysts exist in the same chemical form under both storage and curing conditions. It is desirable to have an in-situ generated catalyst which exists in more inert form during storage conditions but which generates active chemical species during cure, thereby achieving fast cure rate without sacrificing storage life of the epoxy composition. If the catalyst exists in the solid state during storage conditions, reactivity is also lowered due to reduced mobility.

Many candidate latent catalysts are solids that are insoluble in many commonly used organic solvents requiring intensive dispersion in the epoxy compound to achieve homogeneity. Tertiary amines such as benzyldimethylamine are liquids, but catalytic effectiveness is limited. Quaternary ammonium halides are known but halide ions are undesirable contaminants in many applications. Quaternary ammonium acetates exhibit excessive moisture absorption.

Phosphonium and alkali metal bicarbonate compositions are employed as components in epoxy compositions in order to effect chain extension of the epoxy molecules.

Ikeda et al., Japanese Unexamined Patent Application Publication 03149216, discloses a photocurable epoxy composition comprising an onium bicarbonate. A second aluminum organic compound activatable by UV-visible radiation is also required. Exemplified is $Ph_2SHCO_3$ which undergoes photolysis to form $H_2CO_3$.

Bertram et al. U.S. Pat. No. 4,405,766, discloses the use of tetrahydrocarbyl phosphonium bicarbonate as curing catalysts for epoxy resins containing dicarboxylic acid or anhydride crosslinking agents.

Doorakian et al., U.S. Pat. No. 4,354,015, discloses tetrahydrocarbyl phosphonium bicarbonate salts as catalysts for promoting the reaction between (a) vicinal epoxides and (b) phenols. These catalysts are particularly useful in preparing high molecular weight epoxy resins by the advancement reaction of an epoxy resin with a polyhydric phenol. The phosphoium bicarbonates are said by Doorakian et al. to be surprisingly effective at producing substantially linear reaction products.

Dershem, U.S. Patent Application Publication US20100056671, discloses catalysts that can be employed to catalyze the reaction between a phenolic hydroxyl group, a phenyl ester, an anhydride, or a thiol and a vicinal epoxide. Disclosed are quaternary ammonium compounds including benzyl trimethyl ammonium chloride and tetrabutylammonium chloride, as well as butyltriphenylphosphonium bicarbonate. US Christiansen et al., U.S. Pat. No. 7,592,067 discloses alkali-metal-containing cure accelerators for epoxy-coated articles, including an alkali-metal-containing bicarbonate.

SUMMARY OF THE INVENTION

In one aspect, the invention provides a curable composition comprising an epoxy having a plurality of cross-linkable epoxide functional groups, a curing agent, and quaternary ammonium bicarbonate represented by Structure I.

$$R_1R_2R_3R_4N^+HCO_3^- \qquad\qquad I$$

wherein each of $R_1$, $R_2$, $R_3$, and $R_4$ are independently alkyl, phenyl, alkylbenzene, or alkoxy.

In another aspect, the invention provides a method for curing an epoxy composition, the method comprising combining an epoxy having a plurality of cross-linkable epoxide functional groups, a phenolic curing agent, a quaternary ammonium bicarbonate in a solvent to form a reaction mixture, removing said solvent, heating said reaction mixture to a temperature in the range of 120 to 200° C., and maintaining the temperature until the desired level of curing has taken place, wherein the quaternary ammonium bicarbonate is represented by Structure I.

In another aspect, the invention provides a coated article comprising a substrate having disposed thereupon a coating wherein said coating comprises an epoxy having a plurality of cross-linkable functional groups, a curing agent, and a quaternary ammonium bicarbonate, wherein the quaternary ammonium bicarbonate is represented by Structure I.

In another aspect, the invention provides a method for preparing a coated substrate, the method comprising causing an uncured epoxy composition to be coated onto a substrate at a temperature below 100° C., wherein said uncured epoxy composition comprises an epoxy having a plurality of cross-linkable epoxide functional groups, a curing agent, a solvent, and a quaternary ammonium bicarbonate, wherein the quaternary ammonium bicarbonate is represented by Structure I.

In another aspect, the invention provides a method for preparing a multilayer article comprising contacting a first substrate having a coating to an article having a surface such that said coating is disposed between said first substrate and said surface, thereby forming an unconsolidated multilayer article; applying heat and pressure to said multilayer article thereby forming a consolidated multilayer article, said coating comprising an uncured epoxy composition comprising a combination of an uncured epoxy, a phenolic curing agent, and a quaternary ammonium bicarbonate represented by Structure I; wherein said uncured epoxy is advanced to 45 to 85% cure.

BRIEF DESCRIPTION OF THE DRAWINGS

FIG. 1 depicts the procedure for preparing an encapsulated flexible circuit according to the invention.

DETAILED DESCRIPTION OF THE INVENTION

For the purposes of the present invention when a range of values is provided herein, it is intended to encompass the end-points of the range unless specifically stated otherwise. Numerical values used herein have the precision of the number of significant figures provided, following the standard protocol in chemistry for significant figures as outlined in ASTM E29-08 Section 6. For example, the number 40 encompasses a range from 35.0 to 44.9, whereas the number 40.0 encompasses a range from 39.50 to 40.49.

The uncured epoxy suitable for use herein is characterized by a plurality of cross-linkable epoxide functional groups disposed along the polymer chain. In the process of curing, a plurality of epoxide rings disposed on a plurality of polymer chains undergo ring-opening, exposing highly reactive functional groups which then react with another epoxy group or with the curing agent to form cross-links between polymer chains. Once the epoxide has undergone ring-opening, it is no longer an epoxide.

The uncured epoxy composition hereof is soluble in a number of solvents as discussed infra. The corresponding cured species is not soluble in most solvents.

For the purposes of the present invention in any recitation of alternative components of the compositions hereof, it shall be understood that any combination of the listed alternatives can also be employed. For example, when it is recited that the epoxy can be bisphenol A or bisphenol F, it shall be understood that a combination of bisphenol A and bisphenol F is also suitable.

In one aspect, the invention provides a curable composition comprising an epoxy having a plurality of cross-linkable epoxide functional groups, a curing agent, and quaternary ammonium bicarbonate represented by Structure I.

$$R_1R_2R_3R_4N^+HCO_3^-$$      I wherein each of $R_1$, $R_2$, $R_3$, and $R_4$ are independently alkyl, phenyl, alkylbenzene, H, alkoxy, with the proviso that at least one of $R_1$, $R_2$, $R_3$, and $R_4$ is not H.

In one embodiment, the curable composition hereof further comprises a solvent.

Suitable curing agents include phenolic curing agents, anhydrides, and aromatic amines. In one embodiment, the curing agent is a phenol.

Suitable uncured epoxies include but are not limited to epoxies based on bisphenol A, bisphenol F, epoxies based on biphenol, epoxy novolacs (epoxidized phenol formaldehyde), naphthalene epoxy, the trigylcidyl adduct of p-aminophenol, the tetraglycidyl amine of methylenedianiline, and triglycidyl isocyanurates or epoxy adducts of carboxylic acid functionalized rubbers. In some embodiments, the epoxy is a liquid at room temperature, and can act as a solvent for other ingredients. In other embodiments, it is preferable to incorporate the epoxy and curing agent into a solvent, and to disperse the quaternary ammonium bicarbonate therein. Any rubber additives, well as other additives, can also be dispersed in the solvent.

There are many types of epoxies, curing agents, additives, and uses thereof are very well known in the art, and will not be repeated here. Epoxies are discussed and described at considerable length in *The Encyclopedia of Polymer Science and Technology*, Volume 9, pp. 678-904. Virtually any epoxy is suitable for use in the present invention, including epoxies having aliphatic, cycloaliphatic, or aromatic backbones. Selection of any particular type of epoxy depends upon the specific performance required for a particular application. Typically, highly rigid structures and/or high epoxy functionality favor high temperature performance but at the expense of toughness and rigidity.

Phenolic curing agents are particularly preferred for their moderating effects on viscosity of the composition and moderating effect on water uptake. Suitable phenolic curing agents include novolac, bisphenol A, bisphenol F, xylok type phenol resins, dicyclopentadiene type of phenol, terpene modified phenol resin and polyvinylphenol etc, or a combination of two or more of the above compounds.]

Generally for applications requiring the cured material to be flexible, such as in flexible printed circuits, lower epoxy functionality and rigidity, such as epoxies based on bisphenol A or bisphenol F, are more desirable.

Suitable solvents include both polar and nonpolar solvents, including but not limited to benzene, methyl ethyl ketone (MEK), tetrahydrofuran (THF), dioxane, ethyl acetate, or 1-methoxy-2-propanol. In one embodiment of the curable composition hereof, the solvent is MEK. In another embodiment the solvent is 1-methoxy-2-propanol. Most of the quaternary ammonium bicarbonates suitable for the practice of the present invention are insoluble in MEK at room temperature, but are soluble in methanol and some secondary alcohols In one embodiment of the curable composition hereof, in the quaternary ammonium carbonate thereof, one of $R_1$, $R_2$, $R_3$, or $R_4$ is benzyl, and the remainder are methyl; that is, the quaternary ammonium bicarbonate is benzytrimethyl ammonium bicarbonate. In a further embodiment the benzyltrimethyl ammonium bicarbonate is present at a concentration of 0.5 to 5% by mole based upon the total moles of epoxide groups in the curable composition.

For applications where cure initiation above 60° C. is desirable, $R_1$, $R_2$, $R_3$, and $R_4$ are selected such that the melting point and thermal decomposition temperature of the quaternary ammonium bicarbonate hereof is at the desired elevated temperature. Suitable for curing above 60° C. are compositions of the quaternary ammonium bicarbonates hereof wherein one of the groups $R_1$, $R_2$, $R_3$, and $R_4$ is selected from the group: phenyl, alkylbenzene, alkyl from C4 to C25; the remaining three R groups are H, methyl or ethyl. In one embodiment, the quaternary ammonium bicarbonate is benzyltrimethyl ammonium bicarbonate.

In one embodiment, the curable composition is partially cured. This is said in the art to be a curable composition in which the cure has been "advanced." For the purposes of the present invention, the degree of advancement is determined by the percentage of a curing-advanced specimen that is insoluble in a solvent for the corresponding uncured epoxy compound. Further for the purposes of the present invention, the degree of advancement is determined by the percentage of a curing-advanced bisphenol A or bisphenol F epoxy that does not dissolve when the specimen is immersed with agitation in MEK for at least 15 min. at room temperature The partially cured curable composition hereof is 45 to 85%, preferably 55 to 75% advanced.

In one embodiment, the curable composition further comprises plasticizer, filler, carboxy terminated rubber, flame retardants, antioxidants, UV stabilizers, and other such additives that are known in the art to be added to epoxy compositions. In one embodiment, the curable composition further comprises a carboxylic acid functionalized rubber. In another embodiment, the curable composition further comprises a flame retardant.

In another aspect, the invention provides a method for curing an epoxy composition, the method comprising combining an epoxy having a plurality of cross-linkable epoxide functional groups, a phenolic curing agent, a quaternary ammonium bicarbonate in a solvent to form a reaction mixture, removing said solvent, heating said reaction mixture to a temperature in the range of 120 to 200° C., and maintaining the temperature until the desired level of curing has taken place, wherein the quaternary ammonium bicarbonate is represented by Structure I.

In one embodiment, the method further comprises heating said reaction mixture to a temperature in the range of 50 to <120° C. until the curing is advanced 45 to 85% prior to heating to a temperature in the range of 120 to 200° C. In a further embodiment, the curing is advanced 55 to 75%.

Solvent removal can be effected by any convenient means known in the art. Suitable procedures for removing the solvent include evaporation at room temperature with or without reduced pressure; or, by heating to a temperature below the boiling point of the solvent, and lower than the particular curing temperature of the curable composition hereof. Solvent removal that occurs at too high a rate or simultaneously with curing can cause voids in the cured compositon.

In one embodiment of the method for curing hereof the reaction mixture further comprises plasticizer, filler, carboxy terminated rubber, flame retardants, antioxidants, UV stabilizers, and other such additives that are known in the art to be added to epoxy compositions. In one embodiment of the method for curing hereof, the reaction mixture further comprises a carboxy terminated rubber. In another embodiment of the method for curing hereof, the reaction mixture further comprises a flame retardant.

In one embodiment of the method of curing hereof, the quaternary ammonium bicarbonate is benzyltrimethyl ammonium bicarbonate. In a further embodiment the benzyltrimethyl ammonium bicarbonate is present at a concentration of 0.5 to 5% by mole based upon the total molar concentration of epoxide containing material in the curable composition.

In another aspect, the invention provides a method for preparing a coated substrate, the method comprising causing an uncured epoxy composition to be coated onto a substrate at a temperature below 100° C., wherein said uncured epoxy composition comprises an epoxy having a plurality of cross-linkable epoxide functional groups, a curing agent, a solvent, and a quaternary ammonium bicarbonate, wherein the quaternary ammonium bicarbonate is represented by Structure I.

In one embodiment the method further comprises removing the solvent, and heating the coated substrate to a temperature in the range of 50 to <120° C. to advance the cure to 45 to 85%. In a further embodiment the cure is advanced to 55 to 75%.

Uncured epoxies suitable for use in the method for preparing a coated substrate hereof include but are not limited to epoxies based on novolac phenol, cresol novolac, epoxies based on bisphenol A, epoxies based on biphenol, or epoxy adducts of carboxy terminated rubbers.

While a solvent is not strictly required to effect the coating, it is found in the practice of the invention that inclusion of a solvent results in a solution having viscosity in a range that permits the preparation of coatings having a thickness in the range of 10 to 50 micrometers, preferably 15 to 30 micrometers. Lower viscosities also facilitate dispersion of solid particles such as fillers and flame retardants in the composition.

Solvents suitable for use in the method for preparing a coated substrate hereof include but are not limited to acetone, MEK, toluene, dimethylformamide, dimethylacetamide, THF, propylene glycol methyl ether acetate, monopropylenglycol monomethylether or 1-methoxy-2-propanol (Dowanol®PM, available from Dow Chemical Company). Water, alcohol, and ethers can also be used but epoxy adducts of rubbers will not dissolve therein. In one embodiment of the method for preparing a coated substrate hereof, the solvent is MEK or 1-methoxy-2-propanol.

Substrates suitable for use in the method for preparing a coated substrate hereof include but are not limited to films and sheets comprising poly(ethylene terephthalate), poly(ethylene naphthalate), polyethylene, polypropylene, and polyimide. It is highly preferred to pretreat the surface of the film or sheet to enhance adhesion. Treatment by corona discharge has been found to be effective.

Preferred substrates are polyimides. More preferred are fully aromatic polyimides. Most preferred are polyimide films available as Kapton® polyimide film from the DuPont Company.

Coating can be effected by any convenient means known in the art. Good control of coating thickness at thicknesses in the range of 10 to 50 micrometers is obtained using die coating, doctor blade coating, or coating using Meyer rods. Coating can also be effected using spray, pads, hand rollers but those methods provide less effective control over the coating thickness and uniformity, and are therefore less preferred.

Coating technology is extremely well-known in the art. One reference book on the subject is *Organic Coatings Science & Technology*, Wicks et al, ed., John Wiley & Sons, 1999.

In one embodiment of the method of preparing a coated substrate hereof, the quaternary ammonium bicarbonate is benzyltrimethyl ammonium bicarbonate. In a further embodiment the benzyltrimethyl ammonium bicarbonate is present at a concentration of 0.5 to 5% by mole based upon the total molar concentration of epoxide containing material in the uncured coating composition.

In one embodiment, the method for preparing a coated substrate hereof the uncured epoxy composition further comprises plasticizer, filler, carboxy terminated rubber, flame retardants, antioxidants, UV stabilizers, and other such additives that are known in the art to be added to epoxy compositions. In one embodiment of the method for preparing a coated substrate hereof, the uncured epoxy composition further comprises a carboxy terminated rubber. In another embodiment of the method for preparing a coated substrate hereof, the uncured epoxy composition further comprises a flame retardant.

In another embodiment, the method of preparing a coated substrate hereof further comprises applying the coating at room temperature.

In another embodiment, the method of preparing a coated substrate hereof further comprises removal of the solvent by heating at a temperature above room temperature but no higher than 120° C., and in any event, below the curing temperature of the uncured coating.

In another aspect, the invention provides a coated article comprising a substrate having disposed thereupon a coating comprising an uncured epoxy composition comprising a combination of an uncured epoxy, a phenolic curing agent, and a quaternary ammonium bicarbonate represented by Structure I.

Uncured epoxies suitable for use in the coated substrate hereof include but are not limited to novolac phenol, cresol novolac, epoxies based on bisphenol A, epoxies based on biphenol, or epoxy adducts of carboxy terminated rubbers.

Substrates suitable for use in the coated substrate hereof include but are not limited to films and sheets comprising poly(ethylene terephthalate), poly(ethylene naphthalate), polyethylene, polypropylene, and polyimide.

Preferred substrates are polyimides. More preferred are fully aromatic polyimides. Most preferred are polyimide films made from the condensation product of aromatic dianhydrides and aromatic diamines available as Kapton® polyimide film from the DuPont Company.

Suitable substrate films or sheets can contain additives such as flame retardant and others that are typically included films or sheets, so long as the additive does not degrade the usefulness of the invention in the intended application. For example, some additives could degrade the flow of the uncured coating into the interstices of a printed wiring board that it is intended to conformally seal.

In one embodiment the quaternary ammonium bicarbonate is benzyltrimethylammonium bicarbonate.

In one embodiment, the coated substrate hereof the uncured coating further comprises plasticizer, filler, carboxy terminated rubber, flame retardants, antioxidants, UV stabilizers, and other such additives that are known in the art to be added to epoxy compositions. In one embodiment of the coated substrate hereof, the uncured coating further comprises a carboxy terminated rubber. In another embodiment of the coated substrate hereof, the uncured coating further comprises a flame retardant.

In one embodiment of the coated article hereof the uncured epoxy is advanced to 45 to 85% cure. In a further embodiment, the uncured epoxy is advanced to 55 to 75% cure.

The advancement of the cure of the uncured epoxy allows the coating viscosity to be adjusted as needed for the application desired. In preparing encapsulated circuit structures as described infra, it has been found useful in the practice of the invention to advance the cure to 55 to 75% cure. This can be accomplished by thermal treatment of the coated article hereof in the temperature range of 50 to <120° C. The rheology of the coating is thereby controlled so that during the formation of the embodiment of the multi-layer article hereof wherein the coated article hereof is laminated to a circuit structure, the partially cured coating completely fills in the gaps between discrete conductive elements disposed on the circuit substrate, but yet does not exhibit so much flow that it blocks intentional openings in the structure required for external access to the internal conductive elements, such as intentional holes or vias in the board. The advancement of cure in the coating can be effected by any convenient heating means known in the art. This can include treatment in a continuous process during coating, or as a separate step after the coating operation.

In a typical process, advancement of the cure is effected by exposure of the coated article to 50-120° C. for ca. 15 min to 30 hours in order to maintain close control of the rheology of the advanced cure coating, with longer treatment times required for lower exposure temperatures.

To determine the degree to which the cure is advanced in the partially cured coated film or sheet hereof, the solvent extraction process described supra is adapted. It has been found satisfactory to prepare (as by cutting from a larger piece) a 3 cm×2 cm specimen of the coated film or sheet. On two opposite edges of the specimen, a ca. 0.5 cm band of the coating is removed by wiping off with lint free towels soaked in 2-butanone (MEK), leaving a 2 cm×2 cm area of the sample still coated. The specimen is then weighed. The specimen is then clamped on to a glass slide by the two wiped off bands, with the coated surface away from the glass slide and exposed. The clamping helps to prevent the sample from curling during solvent extraction. The clamped sample is immersed in large excess of 2-butanone at room temperature for 15 minutes using a shaker table for agitation. The sample then is removed and dried and weighed again.

In another aspect, the invention provides a method for preparing a multilayer article comprising contacting a first film or sheet having a coating to a second film or sheet having a surface such that said coating is disposed between said first film or sheet and said surface of said second film or sheet, thereby forming an unconsolidated multilayer article; applying heat and pressure to said multilayer article thereby forming a consolidated multilayer article, said coating comprising an uncured epoxy composition comprising a combination of an uncured epoxy, a phenolic curing agent, and a quaternary ammonium bicarbonate represented by Structure I; wherein said uncured epoxy is advanced to 45 to 85% cure.

In one embodiment, said uncured epoxy is advanced to 55 to 75% cure.

In one embodiment, said quaternary ammonium bicarbonate is benzyltrimethyl ammonium carbonate.

In one embodiment, a metallic coating is disposed upon said surface of said second film or sheet. In a further embodiment, the metallic coating describes the discrete conductive pathways of an electrical circuit. Accordingly, the method for forming a multi-layer article hereof further comprises conformingly contacting said coating to said discrete conductive pathways by the application of heat and pressure.

In a further embodiment, the metallic coating is copper.

In one embodiment of the process for preparing a multi-layer article, the multi-layer article is prepared by a lamination process wherein the applied pressure is in the range of 0.7 to 14 MPa. Lamination can be effected using a vacuum press or a quick press, both well-known in the art. Lamination and cure temperature are in the range of 100 to 250° C., preferably 100 to 180° C. In the practice of the invention it is found that in vacuum presses a lamination time of 60-120 minutes is required to obtain suitable flow and curing time. In a "quick press" (such as one available from Top Range Machinery Co. Ltd (Taiwan)), lamination is effected in 1-2 minutes, and curing is completed in a post-cure step in an oven. manufactured by]

Epoxies suitable for use in the coated article useful in the method for preparing the multi-layer article hereof include but are not limited to epoxies based on novolac phenol, cresol novolac, epoxies based on bisphenol A, epoxies based on biphenol, or epoxy adducts of carboxy terminated rubbers.

Substrates suitable for use as the substrate for the coating in the method for preparing the multi-layer article hereof include but are not limited to films and sheets comprising poly(ethylene terephthalate), poly(ethylene naphthalate), polyethylene, polypropylene, and polyimide.

A preferred substrate is a polyimide. More preferred is a fully aromatic polyimide. Most preferred is a polyimide film made from the condensation product of aromatic dianhydrides and aromatic diamines available as Kapton® E polyimide film from the DuPont Company.

In one embodiment of the method for preparing a multi-layer article hereof, the epoxy composition further comprises plasticizer, filler, carboxy terminated rubber, flame retardants, antioxidants, UV stabilizers, and other such additives that are known in the art to be added to epoxy compositions. In one embodiment of the method for preparing the multi-layer article hereof, the coating further comprises a carboxy terminated rubber.

Suitable for use as the second film or sheet in the method for preparing a multilayer article hereof is any low-dielectric material, polymeric or ceramic, glass reinforced or not. Preferred is a polyimide. More preferred is a fully aromatic polyimide. Most preferred are polyimide films made from the condensation product of aromatic dianhydrides and aromatic diamines available as Kapton® polyimide film from the DuPont Company.

In a preferred embodiment, the first film or sheet comprising the partially cured epoxy composition coating hereof is employed in the method hereof to provide a conformal coating to the second film or sheet comprising metallic conductive pathways disposed upon the surface thereof.

Particularly suitable for use in the method for preparing a multilayer article hereof is a circuit structure such as printed wiring board or a flexible circuit comprising a fully aromatic polyimide film or sheet having discrete copper pathways disposed therupon. Suitable circuit structures can be prepared by a process comprising laminating a copper foil to a dielectric film or sheet using a combination of an adhesive layer, often an epoxy, and the application of heat and pressure. To obtain high resolution circuit lines (≤125 micrometers in width) photoresists are applied to the copper surface. A photoresist is a light-sensitive organic material that when subject to imagewise exposure so that when the photoresist is developed and the surface etched, an image will appear in the form of a plurality of discreet conductive pathways upon the surface of the substrate suitable for the practice of the invention.

A photoresist can either be applied as a liquid and dried, or laminated in the form, for example, of polymeric film deposited on a polyester release film. When liquid coating is employed, care must be employed to ensure a uniform thickness. When exposed to light, typically ultraviolet radiation, a photoresist undergoes photopolymerization, thereby altering the solubility thereof in a "developer" chemical. Negative photoresists typically consist of a mixture of acrylate monomers, a polymeric binder, and a photoinitiator. Upon imagewise UV exposure through a patterning photomask, the resist polymerizes and becomes insoluble to the developer. Unexposed areas remain soluble and are washed away, leaving the areas of copper representing the conductive pathways protected by the polymerized photoresist from a subsequent etching step. Positive resists function in the opposite way with exposed areas becoming soluble in the developing solvent. Both positive and negative photoresists are in widespread commercial use. One well-known positive photoresist is the so-called DNQ/Novolac photoresist composition.

Any circuit structure prepared according to the methods of the art is suitable for use in the present invention.

FIG. 1 depicts a suitable procedure for preparing the consolidated multi-layer article hereof. In the embodiment depicted the a coated sheet hereof was used as a cover-layer on the a flexible printed circuit test sheet. Referring to FIG. 1, Kapton® 50FPC polyimide film, [ ]1, coated with one embodiment of the curable composition hereof, 2, was contacted, 5, to copper conductive strips, 3, disposed upon the test sheet, 4, the curable composition, 2, being in direct contact with the copper conductive strips, 3. The unconsolidated multi-layer structure thereby formed, 6, was then consolidated, 7, under vacuum in an OEM Laboratory Vacuum Press by holding the multi-layer structure at 175° C. and 2.25 MPa for 80 minutes, thereby forming a flexible printed wiring board, 8, having fully encapsulated copper conductive pathways. Kapton® 50FPC is just one of many suitable polyimide films In one embodiment, the curable composition comprises bisphenol A or bisphenol F, a phenolic curing agent, benzyltrimethyl ammonium bicarbonate present at a concentration of 0.5 to 5% by mole based upon the total molar concentration of epoxide containing material, the curable composition being advanced to 55 to 75% cure.

EXAMPLES

Example 1

Synthesis of benzyltrimethyl ammonium bicarbonate (BTMAHC)

A glass filtering column was filled to ca. 15 cm high with a 40 weight % solution of benzyltrimethyl ammonium hyroxide (CAS 100-85-6, Aldrich) in water. The column was equipped with a fritted glass perforated disc at the bottom used as a gas dispersion disc. The initial pH of the solution was 12.5. Carbon dioxide gas was bubbled through the column of solution via the perforated glass inlet at the bottom for about 5 hours. The resulting solution had a pH of 7.9. The solution was removed from the column and placed in an open dish inside a vacuum oven at room temperature and dried for about 2 days under vacuum and with a slight nitrogen purge. A dry white solid powder was obtained.

On contacting a sample of the white solid powder with 0.1N HCl solution at room temperature, colorless gas evolved immediately, consistent with the presence of carbonates or bicarbonates.

$^{13}$C NMR of the white solid powder in methanol-d4 was consistent with a benzyltrimethylammonium bicarbonate structure. The following peaks were detected with $^{13}$C NMR (ppm): 53.64-53.71, 71.06 (singlet), 129.69 (singlet), 130.84 (singlet), 132.44 (singlet), 134.54 (singlet), 161.73 (singlet, assigned to carbonyl associated with $HCO_3^-$).

Decomposition of the thus prepared benzyltrimethyl ammonium bicarbonate (BTMAHC) was observed using TGA-Mass Spectrometry in a nitrogen atmosphere. Results indicated the onset of rapid thermal decomposition with simultaneous generation of benzyldimethylamine and methanol at a threshold temperature of ca. 143° C.

The melting point of the thus prepared benzyltrimethyl ammonium bicarbonate was measured in a melting point apparatus (Haake Bulcher, United Kingdom, Model 4A2509) and determined to be about 105° C.

Example 2

A 20 weight % solution of tetrapropylammonium hyroxide (CAS 4499-86-9, Aldrich) in water was placed in the same column described in Example 1. The initial pH of the solution was 13.5. $CO_2$ was bubbled through the solution for about 5 hours. The resulting pH was 7.36. The solution was removed from the column and placed in an open dish inside a vacuum oven and dried for about 4 days at 45° C. under vacuum and with a slight nitrogen purge. A dry white solid powder was obtained.

On contacting a sample of the white solid powder with 0.1N HCl solution at room temperature, colorless gas evolved immediately, consistent with the presence of carbonates or bicarbonates.

nol A (CAS 80-05-7, Aldrich) were dissolved in 1.131 g methanol a small beaker with stirring. 0.0556 g of the tetrapropylammonium bicarbonate prepared in Example 2 was then added. The solution was mixed and then cast on an aluminum dish. It was allowed to dry in a vacuum oven for about 1 hr. at 40° C.

Comparative Examples B-E

Comparative Examples B-E were prepared in a manner identical to that of Example 3, except that the BTMAHC was replaced by other potential catalysts at the same molar concentration, as shown in Table 1. As in Example 3, each solution was mixed and then cast on an aluminum dish. The resulting film was dried in vacuum oven at 40° C. for ca. 2 hours with dry nitrogen gas purge.

Gel time tests were conducted per The Institute for Interconnecting and Packaging Electronic Circuits IPC-TM-650 test method 2.3.18. Results are shown in Table 1

TABLE 1

|   | Example 3 | Example 4 | Comparative Ex. B | Comparative Ex. C | Comparative Ex. D | Comparative Ex. E |
|---|---|---|---|---|---|---|
| DER332, g | 2.000 | 2.000 | 2.000 | 2.000 | 2.000 | 2.000 |
| Bisphenol A, g | 0.640 | 0.640 | 0.640 | 0.640 | 0.640 | 0.640 |
| Catalyst | Benzyltrimethyl bicarbonate | Tetrapropylammonium bicarbonate | Benzyl-dimethylamine (CAS 103-83-3) | Benzyl-trimethyl-chloride (CAS 56-37-1) | Benzyl-trimethyl-bromide (CAS 5350-41-4) | Tetra-methyl-ammonium chloride (CAS 75-57-0) |
| Weight of catalyst, g | 0.0528 | 0.0556 | 0.0337 | 0.0416 | 0.0516 | 0.02993 |
| Mole catalyst per mole epoxide | 0.02 | 0.02 | 0.02 | 0.02 | 0.02 | 0.02 |
| 170° C. gel time, sec | 56 | 52 | >2700 | >2700 | >2700 | >2000 |

The melting point of the thus prepared solid was measured in a melting point apparatus (Haake Bulcher, United Kingdom, Model 4A2509) and determined to be about 70° C.

Example 3

2.000 g of DER332 diglycidyl ether of bisphenol A (Dow Chemical Co., epoxide equivalent 178) and 0.640 g of bisphenol A (CAS 80-05-7, Aldrich) were dissolved in 1.131 g methanol in a small beaker with stirring. 0.0528 g of the BTMAHC prepared in Example 1 was then added. The solution thus formed was mixed and then cast on an aluminum dish. It was allowed to dry in an oven for about 20 hrs at 40° C. The resulting solid was analyzed using differential scanning calorimetry in nitrogen. The analysis showed a sharp exotherm of 257 J/g centered at 124° C.

Comparative Example A

E115282-36

The materials and procedures of Example 2 were replicated except that the BTMAHC was excluded. The resulting product was treated identically to that in Example 2. The resulting solid was analyzed using differential scanning calorimetry in nitrogen. The results show no significant thermal event below 180° C.

Example 4

2.000 g of DER332 diglycidyl ether of bisphenol A (Dow Chemical Co., epoxide equivalent 178) and 0.640 g of bisphe- Examples 5,6,7 and Comparative Example F

TABLE 2

| Ingredients list: | | |
|---|---|---|
| Epon ™ 58005 | elastomer modified epoxy functional adduct | (Hexion Specialty Chemicals, Inc.). |
| D.E.R. ™ 331 ™ | diglycidyl ether of bisphenol A | (Dow Chemical Co., epoxide equivalent 182-192). |
| GP 5833 | phenolic novolac resin with hydroxyl equivalent of 104 | (Georgia-Pacific Resins Inc.). |
| Nipol ® 1072 J | poly(acrylonitrile-butadiene) rubber with carboxylic acid functional cure sites | (Zeon Corporation, Japan). |
| Vamac ® G | ethylene-acrylic rubber | (DuPont Company). |
| Melapur 200 | melamine polyphosphate flame retardant | (Ciba Specialty Chemicals). |

TABLE 3

| Weight % | Example 5 | Example 6 | Comparative Example F | Example 7 |
|---|---|---|---|---|
| Epon 58005 | 20.83% | 20.83% | 20.97% | 20.83% |
| DER331 | 13.89% | 13.89% | 13.98% | 13.89% |
| GP5833 | 6.94% | 6.94% | 6.99% | 6.94% |
| Nipol 1072J | 22.91% | 22.91% | 23.06% | — |
| Vamac ® G | — | — | — | 22.91% |
| BTMA.HC | 0.42% | 0.42% | — | 0.42% |
| Melapur 200 | 35.0% | 35.0% | 35.0% | 35.0% |
| Solvent | 1-Methoxy-2-propanol | 2-butanone | 1-Methoxy-2-propanol | 1-Methoxy-2-propanol |

Example 5

30 g of solids in the percentages shown in Table 3 were dissolved in 49 g of of 1-methoxy-2-propanol. Epon™ 58005. D.E.R.™ 331™, and Melapur 200 were mixed into the 1-methoxy-2 propanol (Aldrich). The mixture was dispersed with a Silverson Model L5M-A homogenizer for 2 minutes at 8000 rpm. The remaining ingredients (GP5833 and Nipol® 1072 J)) were then added, and the mixture dispersed again with the Silverson homogenizer for another 2 minutes at 8000 rpm. BTMAHC was first dissolved in about 2 ml of 1-methoxy-2 propanol and then added to the mixture. The final coating solution was stirred for 2 minutes to form a coating solution.

The thus formed coating solution was then coated as a film onto a 50-micrometer thick Kapton® HN (DuPont Company) polyimide film using a doctor blade with a 127-micrometer gate opening. The coating was then dried in a vacuum oven at 100° C. for 5 min, then placed in an air circulating oven for 15 min at 120° C. to partially cure. The films were then stored in a refrigerator until further use.

Following the method outlined supra, the degree of cure of the thus prepared partially cured sample was determined to be 62% cured. That is, 38% by weight of the coating was extracted into solution.

Example 6

A coating solution was prepared in the manner of Example 5 except that 2-butanone was employed as the solvent. The solid ingredients were combined in the percentages shown. Since BTMAHC has limited solubility in 2-butanone, it was dissolved in about 2 ml of methanol and then added to the coating dispersion.

A coated Kapton® film was prepared, heated, and stored as in Example 5.

Example 7

The materials and procedures of Example 5 were replicated except that Vamac® G was employed in place of Nipol® 1072 J.

A coated Kapton® film was prepared, heated, and stored as in Example 5.

Comparative Example F

A coating composition dispersion was prepared as in Example 5 except that BTMAHC was excluded, and the percentages of the other materials are therefore shown in Table 3 as adjusted appropriately.

A coated Kapton® film was prepared, heated, and stored as in Example 5.

Samples of the adhesive of examples 5,6,7 and comparative example F were cured in an air oven at 177° C. for 80 min. The cured samples were then cut and tested for flammability per Underwriters Laboratory UL94 VTM test procedure. The results are shown in Table 4

TABLE 4

| | Example 5 | Example 6 | Comp. Ex. F | Example 7 |
|---|---|---|---|---|
| UL-94 VTM-0 | Pass | Pass | Fail | Pass |

Examples 8, 9, 10, and Comparative Example G

The coated Kapton® films prepared in Examples 5,6,7, and Comparative Example F were laminated to Pyralux® AC182000R (DuPont Company). Pyralux® AC182000R was a laminate constructed of a 20 micrometer thick polyimide film cast onto an 18 micrometer thick RA copper foil.

The lamination was performed by contacting the copper surface of the Pyralux® AC182000R with the coated side of the coated Kapton® films of Examples 5, 6, and 7, and Comparative Example F, and applying a pressure of 2.2 MPa at 177° C. for 80 min using an OEM Press Systems, Inc. 40-ton vacuum press, to form a multi-layer article.

Each of the multi-layer articles so formed was cut into 6 mm wide strips. The samples had been laminated with a portion of the adhesive along one side wiped away before lamination so as to leave a region of no adhesive between Cu and Kapton®. On the adhesive-free end, the Kapton® film was clamped on a table. The Cu layer (not adhered by epoxy) was clamped to a Mark-10 Corporation Model MG2 force gauge which recorded the peak force during the pull. The copper layer was pulled away from the adhesive at about 160° angle. The pull force was recorded. The results are shown in Table 5. The force gauge+Cu was pulled away from the adhesive layer by hand. The ~160° angle was judged visually. The adhesive strength shown in the table represents an average of 2 replicates.

TABLE 5

| Weight % | Example 8 | Example 9 | Comparative Example G | Example 10 |
|---|---|---|---|---|
| Peak Cu Peel Strength, N/mm width | 0.94 | 0.85 | 1.0 | 0.83 |

Examples 11, 12, and 13, and Comparative Example H

The coated Kapton® films prepared in Examples 5,6,7 and comparative example F were laminated to a copper test pattern to test their ability to conform to the copper pattern during lamination. The test pattern consisted of parallel lanes of copper 125 micrometers wide and 18 micrometers deep. There was 125 micrometer spacing between. The pattern was produced using common photolithography and copper etching techniques.

The coated films of Examples 5, 6, and 7, and Comparative Example F were laminated to the test pattern, with the adhesive facing the etched copper pattern. The multi-layer article so prepared was placed in an OEM Press System Company 40-ton vacuum press and held at 177° C. at 2.25 Mpa for 80 min.

The test wass considered a "pass" if no void was detected under inspection using an optical microscope.

TABLE 6

| Weight % | Example 11 | Example 12 | Comparative Example G | Example 13 |
|---|---|---|---|---|
| Cu conformation | Pass | Pass | Pass | Pass |

I claim:
1. A method for preparing a multilayer article comprising contacting a film or sheet having a coating to an article having a surface such that said coating is disposed between said film or sheet and said surface, thereby forming an unconsolidated multilayer article; applying heat and pressure to said multilayer article thereby forming a consolidated multilayer article, said coating comprising an uncured epoxy composition comprising a combination of an uncured epoxy, a phenolic curing agent, and a quaternary ammonium bicarbonate, wherein said uncured epoxy is advanced to 45 to 85% cure; and, wherein said quaternary ammonium bicarbonate is represented by Structure I $$R_1R_2R_3R_4N^+HCO_3^- \qquad I$$

wherein each of R1, R2, R3, and R4 are independently alkyl, phenyl, alkylbenzene, or alkoxy.

2. The method of claim 1 wherein the quaternary ammonium bicarbonate is benzyltrimethyl ammonium bicarbonate.

3. The method of claim 1 wherein the epoxy is advanced to 55 to 75% cure.

4. The method of claim 1 wherein the epoxy comprises bisphenol A or bisphenol F.

5. The method of claim 1 wherein the surface further comprises one or more discrete metallic conductive pathways.

6. The method of claim 1 further comprising heating to a temperature in the range of 100-180° C.

7. The method of claim 6 wherein the epoxy comprises bisphenol A or bisphenol F, the quaternary ammonium bicarbonate is benzyltrimethyl ammonium bicarbonate, the epoxy is advanced to 55 to 75% cure, and the surface comprises one or more discrete metallic conductive pathways.

8. The method of claim 1 wherein said film or sheet is a polyimide film or sheet.

9. The method of claim 7 wherein said film or sheet is a polyimide film or sheet.

10. The method of claim 8 wherein said polyimide is a fully aromatic polyimide.

11. The method of claim 9 wherein said film or sheet is a fully aromatic polyimide.

* * * * *